US010031422B2

(12) United States Patent
Nikipelov et al.

(10) Patent No.: US 10,031,422 B2
(45) Date of Patent: Jul. 24, 2018

(54) LITHOGRAPHIC APPARATUS

(71) Applicant: ASML Netherlands B.V., Veldhoven (NL)

(72) Inventors: Andrey Nikipelov, Eindhoven (NL); Vadim Yevgenyevich Banine, Deurne (NL); Andrei Mikhailovich Yakunin, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/438,482

(22) PCT Filed: Sep. 23, 2013

(86) PCT No.: PCT/EP2013/069713
§ 371 (c)(1),
(2) Date: Apr. 24, 2015

(87) PCT Pub. No.: WO2014/063878
PCT Pub. Date: May 1, 2014

(65) Prior Publication Data
US 2015/0286145 A1    Oct. 8, 2015

Related U.S. Application Data

(60) Provisional application No. 61/718,908, filed on Oct. 26, 2012.

(51) Int. Cl.
*G03F 7/00* (2006.01)
*G03F 7/20* (2006.01)
(Continued)

(52) U.S. Cl.
CPC ..... *G03F 7/70033* (2013.01); *G02B 17/0657* (2013.01); *G02B 17/0808* (2013.01);
(Continued)

(58) Field of Classification Search
CPC ............ G03F 7/70033; G03F 7/70041; G03F 7/7005; G02B 17/0657; G02B 17/0808; H05G 2/006; H05G 2/008
(Continued)

(56) References Cited

U.S. PATENT DOCUMENTS 3,723,246 A    3/1973   Lubin
4,058,486 A    11/1977  Mallozzi et al.
(Continued)

FOREIGN PATENT DOCUMENTS

EP    2 191 698 B1    10/2012
EP    2 563 099 A1    2/2013
(Continued)

OTHER PUBLICATIONS

International Search Report directed to related International Patent Application No. PCT/EP2013/069713, dated Aug. 19, 2014; 6 pages.
(Continued)

*Primary Examiner* — Nicole Ippolito
*Assistant Examiner* — Hanway Chang
(74) *Attorney, Agent, or Firm* — Sterne, Kessler, Goldstein & Fox P.L.L.C.

(57) ABSTRACT

A radiation source for a lithographic apparatus uses a plurality of fiber lasers to ignite a fuel droplet at an ignition location to generate EUV radiation. The fiber lasers may be provided to emit parallel to an optical axis and a telescopic optical system is provided to focus the lasers at the ignition location, or the lasers may be directed towards the optical axis with a final focus lens being used to reduce beam waist. The lasers may be provided in two or more groups to allow them to be independently controlled and some of the lasers
(Continued)

may be focused at a different location to provide a pre-pulse. Radiation from fiber lasers may also be combined using dichroic mirrors.

23 Claims, 8 Drawing Sheets

(51) Int. Cl.
  *G02B 17/08* (2006.01)
  *H05G 2/00* (2006.01)
  *G02B 17/06* (2006.01)
(52) U.S. Cl.
  CPC ........ *G03F 7/7005* (2013.01); *G03F 7/70041* (2013.01); *H05G 2/006* (2013.01); *H05G 2/008* (2013.01)
(58) Field of Classification Search
  USPC .............................. 250/493.1, 503.1, 504 R
  See application file for complete search history.

(56) References Cited

U.S. PATENT DOCUMENTS

| 7,236,297 | B1 | 6/2007 | Ackermann et al. |
| 8,107,167 | B2 | 1/2012 | Galvanauskas et al. |
| 8,319,201 | B2 | 11/2012 | Vaschenko |
| 8,604,453 | B2 | 12/2013 | Endo et al. |
| 9,559,483 | B2 | 1/2017 | Fermann et al. |
| 2004/0057475 | A1 | 3/2004 | Frankel et al. |
| 2006/0140232 | A1 | 6/2006 | Hergenhan et al. |
| 2006/0215712 | A1 | 9/2006 | Ziener et al. |
| 2008/0179548 | A1 | 7/2008 | Bykanov et al. |
| 2009/0014668 | A1 | 1/2009 | Vaschenko |
| 2009/0250639 | A1 | 10/2009 | Banine et al. |
| 2010/0090133 | A1 | 4/2010 | Endo et al. |
| 2010/0171049 | A1 | 7/2010 | Moriya et al. |
| 2010/0181503 | A1 | 7/2010 | Yanagida et al. |
| 2011/0253349 | A1 | 10/2011 | Ershov et al. |
| 2011/0317256 | A1 | 12/2011 | Hou et al. |
| 2012/0248344 | A1 | 10/2012 | Wakabayashi et al. |
| 2013/0088697 | A1 | 4/2013 | Labetski et al. |

FOREIGN PATENT DOCUMENTS

| JP | 2010-103499 A | 5/2010 |
| JP | 2010-533386 A | 10/2010 |
| JP | 2010-537377 A | 12/2010 |
| JP | 2011-512653 A | 4/2011 |
| JP | 2012-169241 A | 9/2012 |
| WO | WO 2004/097250 A2 | 11/2004 |
| WO | WO 2005/093487 A1 | 10/2005 |
| WO | WO 2011/131431 A1 | 10/2011 |

OTHER PUBLICATIONS

International Preliminary Report on Patentability and Written Opinion of the International Searching Authority directed to related International Patent Application No. PCT/EP2013/069713, dated Apr. 28, 2015; 10 pages.

LITHOGRAPHIC APPARATUS

CROSS-REFERENCE TO RELATED APPLICATIONS

This application claims the benefit of U.S. provisional application 61/718,908, which was filed on Oct. 26, 2012, and which is incorporated herein in its entirety by reference.

FIELD

The present invention relates to a lithographic apparatus and in particular to a radiation source for use in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a radiation source collector module for containing the plasma. The plasma may be created, for example, by directing a laser beam at a fuel, such as particles (i.e., droplets) of a suitable fuel material (e.g., tin, which is currently thought to be the most promising and thus likely choice of fuel for EUV radiation sources), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector (sometimes referred to as a near normal incidence radiation collector), which receives the radiation and focuses the radiation into a beam. The source collector module may include an enclosing structure or chamber arranged to provide a vacuum environment to support the plasma. Such a radiation system is typically termed a laser produced plasma (LPP) source.

Conventionally LPP sources use a $CO_2$ laser to produce the plasma. A conventional $CO_2$ laser may have an output power of up to 40 kW which in an LPP source is sufficient to generate 250 W of in-band EUV radiation. However, to increase the throughput of EUV lithographic apparatus it would be desirable to generate about 1 kW of in-band EUV radiation. This is impractical with conventional $CO_2$ laser designs as they cannot be scaled up beyond 40 kW because of the resultant size and cost of the apparatus.

SUMMARY

It is desirable to obviate or mitigate at least one problem of the prior art, whether identified herein or elsewhere, or to provide an alternative to existing apparatus or methods.

According to a first aspect of the present invention, there is provided a lithographic apparatus including a radiation source comprising an array of individual lasers and a beam compression system, wherein said lasers are configured to be focused at a common focal point to which in use a fuel target may be supplied. Preferably the lasers are fiber lasers.

In some embodiments of the invention the radiation source includes an optical axis and the plurality of individual fiber lasers are arranged such that they emit radiation that is parallel to the optical axis. The fiber lasers are preferably arranged symmetrically about the optical axis. Preferably an optical system collects radiation from the plurality of individual fiber lasers and focuses the radiation at the common focal point. The optical system is preferably a telescopic optical system. The optical system may include a first mirror for collecting radiation emitted by the plurality of individual lasers, a second mirror that receives radiation from the first mirror and which directs the radiation to a final focusing lens.

Preferably a blocking element for back-scattered radiation and having an orifice may be provided between the first and second mirrors.

In some embodiments of the invention the first mirror is formed with an opening located on the optical axis. In such embodiments the apparatus may further comprise a fuel delivery system for delivering fuel targets for ignition at the common focal point, and a collector for collecting radiation generated by ignition of said fuel targets, wherein the collector is provided between the common focal point and the first mirror. In such embodiments the collector may have an opening and the fuel delivery system may extend through the opening in the first mirror and the opening in the collector. The opening may be provided on the optical axis.

In some embodiments the collector has an opening located on the optical axis and a gas flow guide extends through the opening in the first mirror and the opening in the collector for delivering a gas to the surface of the collector.

In other embodiments the plurality of individual fiber lasers are arranged about an optical axis such that radiation emitted by the lasers is directed towards the optical axis. Preferably a final focusing lens is provided for focusing said radiation on the common focal point. This has the advantage of reducing beam waist.

In other embodiments the radiation emitted by the plurality of individual lasers is combined into a single radiation beam by a plurality of dichroic mirrors.

The individual fiber lasers are mounted on a mounting plate.

Each individual fiber laser may be provided with a collimator.

In preferred embodiments of the invention the plurality of individual fiber lasers are arranged into more than one group whereby each group may be individually controlled. The fiber lasers in one such group may be fired at a different time from the lasers in another such group. The radiation from the lasers in one group may be focused at a different location from the lasers in another group. Individual lasers or groups of lasers may be fired in sequence to shape a power pulse as a function of time.

In some embodiments of the invention a selected group or groups of lasers may be configured to provide a pre-pulse. Such a group or groups of lasers providing the pre-pulse may be focused at a different location from the remaining lasers. The group or groups of lasers providing the pre-pulse may be operated at a different wavelength from the remaining lasers.

In embodiments of the invention the individual fiber lasers emit radiation at a wavelength of from 1 to 5 µm. Preferably each individual laser emits at a power of greater than 1 W.

In some embodiments of the invention at least some of said fiber lasers may be provided with phase control by heating a section of said fiber lasers or by subjecting said fiber lasers to mechanical stress.

Preferably each said fiber laser is provided with a collimator. Each such collimator may be located at an end of a respective fiber laser and each such collimator and each such fiber laser end may be immersed in a liquid.

According to another aspect of the present invention there is provided a method of generating radiation for use in a lithographic apparatus comprising, supplying a fuel target to an ignition location, and igniting said fuel targets with laser radiation to generate a plasma, wherein said laser radiation is emitted from a plurality of individual lasers configured to be focused at a common focal point by a beam compression system.

According to another aspect of the invention there is provided a radiation source for a lithographic apparatus, wherein said radiation source comprises a plurality of individual fiber lasers arranged such that they emit radiation that is generally parallel to an optical axis, and an optical system that collects radiation from said plurality of individual fiber lasers and focuses said radiation at a common focal point to which in use a fuel target may be supplied.

According to another aspect of the invention there is provided a radiation source for a lithographic apparatus, wherein said radiation source comprises a plurality of individual fiber lasers arranged such that they emit radiation directed towards an optical axis, and a lens that collects radiation from said plurality of individual fiber lasers and focuses said radiation at a common focal point to which in use a fuel target may be supplied.

According to another aspect of the invention there is provided a radiation source for a lithographic apparatus, wherein said radiation source comprises a plurality of individual fiber lasers arranged such that radiation emitted by said plurality of individual lasers is combined into a single radiation beam by a plurality of dichroic mirrors.

One or more aspects of the invention may, where appropriate to one skilled in the art, be combined with any one or more other aspects described herein, and/or with any one or more features described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
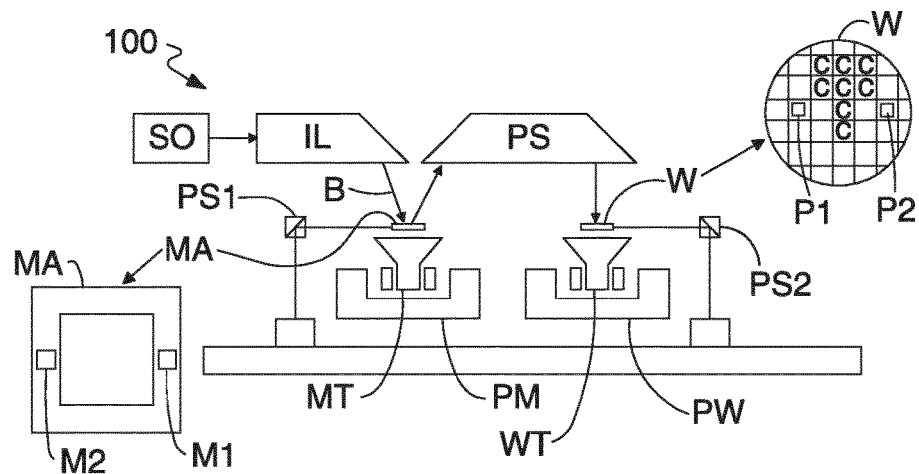
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus 100 including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a fuel stream generating for generating a stream of fuel and/or a laser (neither of which are shown in FIG. 1), for providing the laser beam for exciting the fuel. The resulting plasma emits output radiation, e.g., EUV radiation, which is collected using a radiation collector, disposed in the source collector module. The laser and/or fuel stream generator and the collector module (often referred to as a source collector module), may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:
1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
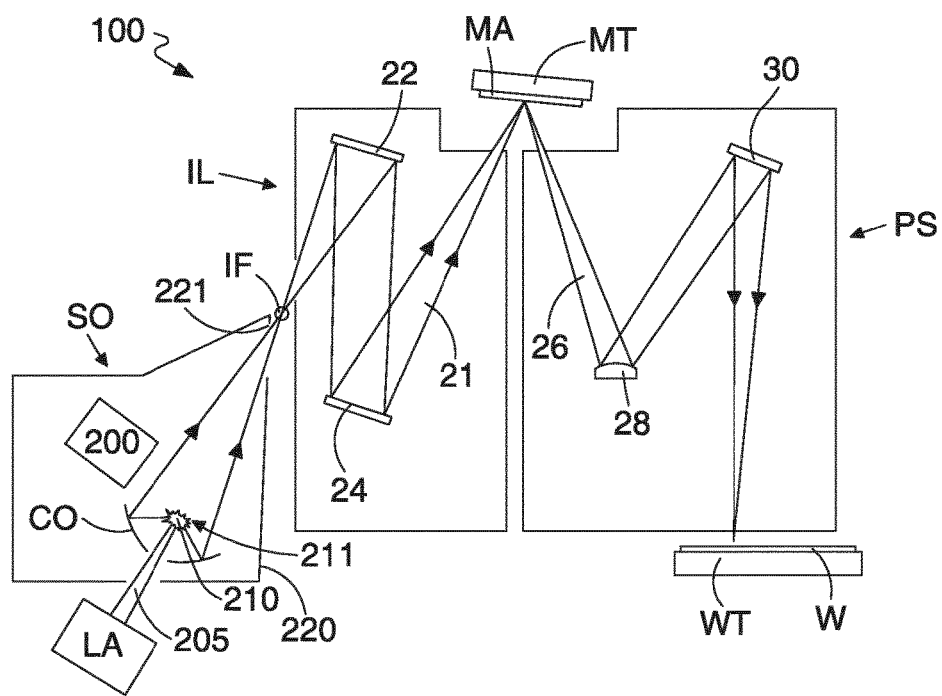
FIG. 2 is a more detailed view of the apparatus of FIG. 1, including an LPP source collector module.

FIG. 2 shows the lithographic apparatus 100 in more detail, including the source collector module SO, the illumination system IL, and the projection system PS. The source collector module SO is constructed and arranged such that a vacuum environment can be maintained in an enclosing structure 220 of the source collector module.

A laser LA is arranged to deposit laser energy via a laser beam 205 into a fuel, such as xenon (Xe), tin (Sn) or lithium (Li), which is provided from a fluid stream generator 200. Liquid (i.e., molten) tin (most likely in the form of droplets), or another metal in liquid form, is currently thought to be the most promising and thus likely choice of fuel for EUV radiation sources. The deposition of laser energy into the fuel creates a highly ionized plasma 210 at a plasma formation location 211, which has electron temperatures of several tens of electron volts (eV). The energetic radiation generated during de-excitation and recombination of these ions is emitted from the plasma 210, collected and focused by a near normal incidence radiation collector CO (sometimes referred to more generally as a normal incidence radiation collector). The collector CO may have a multilayer structure, for example one tuned to reflect, more readily reflect, or preferentially reflect, radiation of a specific wavelength (e.g., radiation of a specific EUV wavelength). The collector CO may have an elliptical configuration, having two natural ellipse focus points. One focus point will be at the plasma formation location 211, and the other focus point will be at the intermediate focus, discussed below.

A laser LA and/or fluid stream generator 200 and/or a collector CO may together be considered to comprise a radiation source, specifically an EUV radiation source. The EUV radiation source may be referred to as a laser produced plasma (LPP) radiation source. The collector CO in the enclosing structure 220 may form a collector module, which forms a part of the radiation source (in this example).

A second laser (not shown) may be provided, the second laser being configured to provide a pre-pulse to pre-shape the fuel before the laser beam 205 is incident upon it. An LPP source that uses this approach may be referred to as a dual laser pulsing (DLP) source.

Although not shown, the fuel stream generator will comprise, or be in connection with, a nozzle configured to direct a stream of, for example, fuel droplets along a trajectory towards the plasma formation location 211. It will be understood that the fuel may take any other suitable form such as one or more streams, one or more jets, and may be solid, liquid or gaseous in form. The term fuel target will be used herein to encompass such possibilities.

Radiation B that is reflected by the radiation collector CO is focused at a virtual source point IF. The virtual source point IF is commonly referred to as the intermediate focus, and the source collector module SO is arranged such that the intermediate focus IF is located at or near to an opening 221 in the enclosing structure 220. The virtual source point IF is an image of the radiation emitting plasma 210.

Subsequently, the radiation B traverses the illumination system IL, which may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation at the patterning device MA, held by the support structure MT, a patterned beam 26 is formed and the patterned beam 26 is imaged by the projection system PS via reflective elements 28, 30 onto a substrate W held by the wafer More elements than shown may generally be present in the illumination system IL and projection system PS. Furthermore, there may be more mirrors present than those shown in the figures, for example there may be 1-6 additional reflective elements present in the projection system PS than shown in FIG. 2.

As discussed above, conventionally the laser LA would be a single $CO_2$ laser, but this may be insufficient to meet future requirements for increased in-band EUV power. In embodiments of the invention the source comprises a plurality of fiber lasers. The fiber lasers may, for example, be diode pumped fiber lasers that emit at a wavelength of between 1-5 μm. A suitable diode pumped fiber laser may, for example, be one based on gadolinium. The power per fiber laser may be >10 W and may be potentially be as high as 100 W. Optimally in embodiments of the present invention there may be from 100 to 1000 individual fiber lasers giving a total power output of the order of 100 kW.

Figure 3:
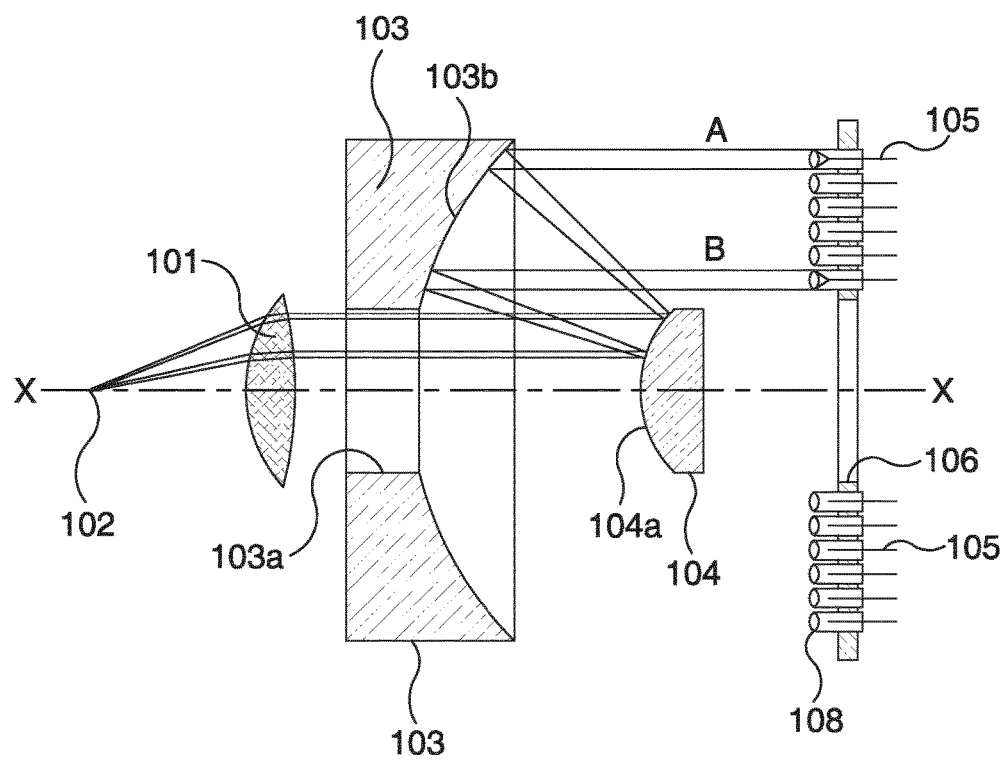
FIG. 3 schematically depicts a radiation source according to an embodiment of the present invention.

FIG. 3 shows a first embodiment of the invention. A plurality of individual fiber lasers 105 are mounted in a two-dimensional array on a mounting plate 106. The lasers 105 preferably have a beam quality $M^2<2$ with a wavelength of between 1-5 μm and are provided with collimating optics 108 at their outputs to produce parallel output beams. Collimating optics 108 may comprise a collimator provided at the end of each fiber laser, and the collimator and the end of the fiber laser may be immersed in liquid for cooling purposes and to prevent laser spark breakdown at the end of the fiber laser where the laser power flux is highest. The mounting plate 106 is disposed perpendicularly to an optical axis X-X such that each individual fiber laser 105 emits radiation parallel to the optical axis. The lasers 105 are preferably mounted in an axially symmetric manner such that the radiation they emit is axially symmetric. The lasers may, for example, be mounted in an annular array. Since a significant percentage of the output laser radiation will be reflected directly back (as much as 10%) cooling means may be provided as part of the mounting plate 106. The mounting plate 106 may also be provided with means for adjusting the lasers—both collectively and individually—to ensure correct orientation of the lasers 105.

The embodiment of FIG. 3 also includes an optical system that acts as a beam compression system and is capable of combining the outputs of the individual fiber lasers 105 and focusing them at a single location (e.g., where a fuel droplet is delivered for EUV generation). In the embodiment of FIG. 3 this optical system includes a first mirror 103 located on the optical axis X-X and having an aperture 103*a* through which the optical axis X-X passes. First mirror 103 is formed with a concave reflecting surface 103*b* that faces fiber lasers 105. First mirror 103 receives radiation from lasers 105 and surface 103*b* reflects radiation to second mirror 104 which is disposed on the optical axis X-X and has a convex reflecting surface 104*a*. Radiation propagating from surface 104*a* is directed parallel to the optical axis and through the aperture 103*a* to a lens 101 that focusses the radiation at a desired location 102. Mirrors 103 and 104 may be cooled if necessary. For convenience of illustration in FIG. 3 A indicates a beam of radiation emitted from an outermost fiber laser 105 and B indicates a beam of radiation emitted from an innermost fiber laser 105 with respect to the optical axis. The optical system described above is of a telescopic nature that is very compact in size which is highly beneficial.

Figure 4:
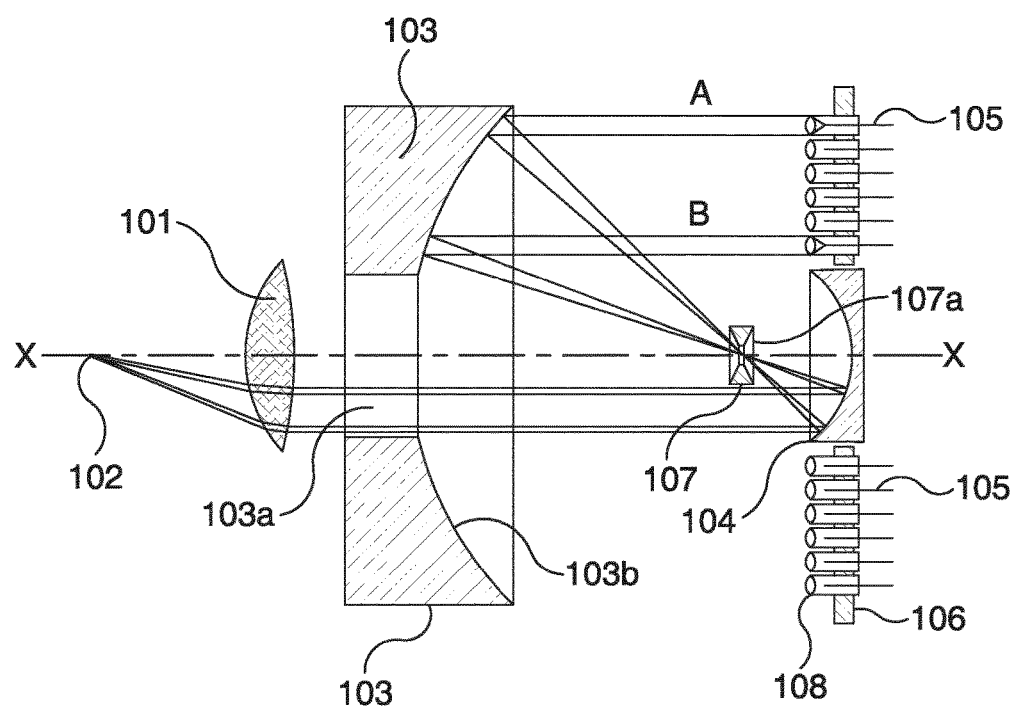
FIG. 4 schematically depicts a radiation source according to another embodiment of the present invention.

FIG. 4 shows another embodiment of the invention in which the optical beam compression system is in a telescope configuration with an intermediate focus and an orifice to block radiation which is back scattered by the target material and the plasma formed from the target material. In this embodiment the second mirror 104 is preferably located in the centre of the mounting plate 106 and has a concave reflecting surface 104*a* that faces reflecting surface 103*b* of the first mirror 103. Second mirror 104 received radiation from first mirror 103 and re-directs the radiation parallel to the optical axis X-X and through aperture 103*a* to lens 101 that focusses the radiation at a desired location 102 as in the first embodiment. A difference in this embodiment is that radiation reflected from first mirror 103 to the second mirror 104 passes through an intermediate focus point at which is located a blocking element 107 with a central orifice 107*a*. Blocking element 107 serves to block back scattered radiation from the target material and the plasma formed from the target material which may otherwise damage the lasers 105.

Figure 5:
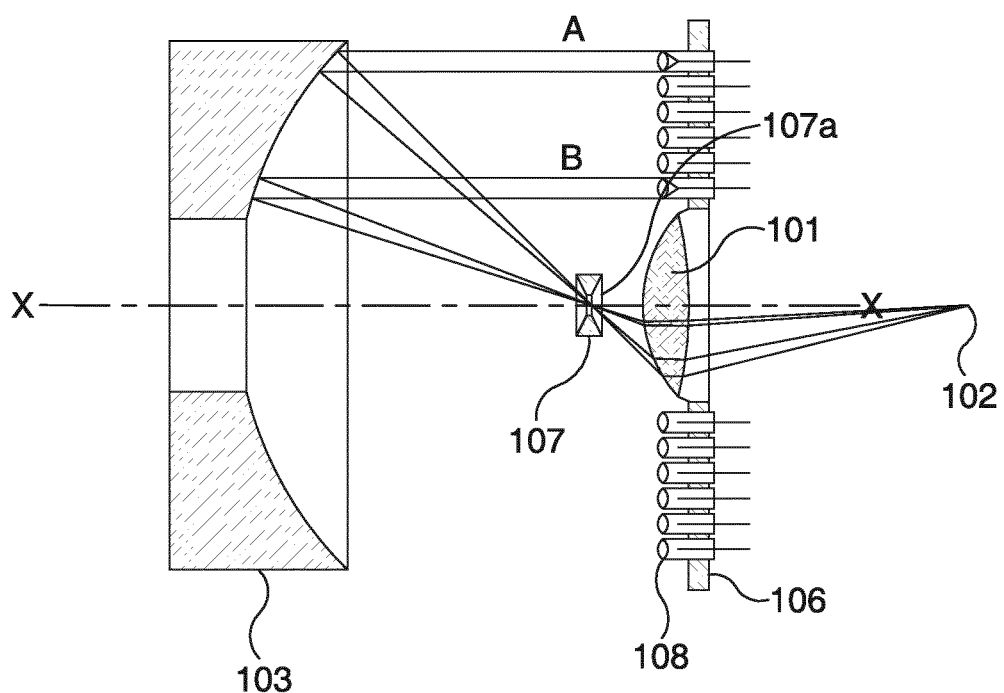
FIG. 5 schematically depicts a radiation source according to another embodiment of the present invention.

FIG. 5 shows another embodiment of the invention. The embodiment of FIG. 5 is similar to that of FIG. 4 except that the second mirror 103 is replaced by an imaging lens 101 located preferably centrally (though not necessarily) in the mounting plate 106 and which focuses the radiation at desired location 102 which in this embodiment is located behind the mounting plate. As in the embodiment of FIG. 4 radiation from the lasers 105 is received by first mirror 103 which re-directs the radiation to the lens 101 via an intermediate focus point at which is located a blocking element 107 with a central orifice 107*a*. Blocking element serves to block back reflected radiation.

Figure 6:
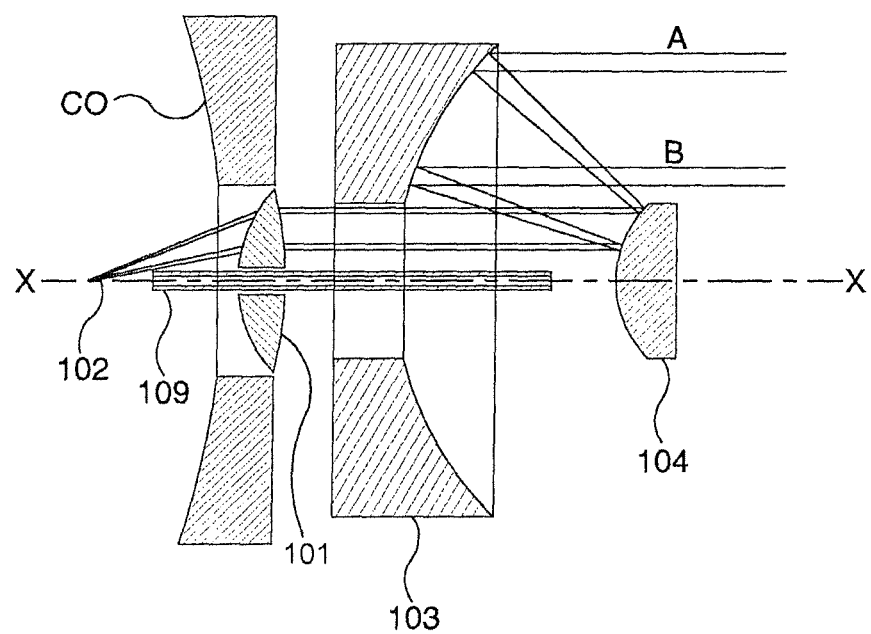
FIG. 6 schematically depicts a radiation source according to another embodiment of the present invention.

In the embodiments described above the radiation from the multiple lasers 105 surrounds the optical axis rather than being on the optical axis. This means that the optical axis may be available for the fuel droplet delivery system and/or a gas flow delivery system. This is illustrated in FIG. 6 which in addition to the first and second mirrors 103,104 of the embodiment of FIG. 4 shows additionally a delivery conduit 109 extending along the optical axis through aperture 103*a* in first mirror 103, and a central aperture in lens 101. FIG. 6 also shows collector CO located around the lens 101. Delivery conduit 109 may, for example, be a conduit for delivering a target to the focus point 102, e.g., fuel droplets, or may be a conduit delivering a protective gas that is used to prevent contaminants being deposited on the surface of the collector CO.

Figure 7:
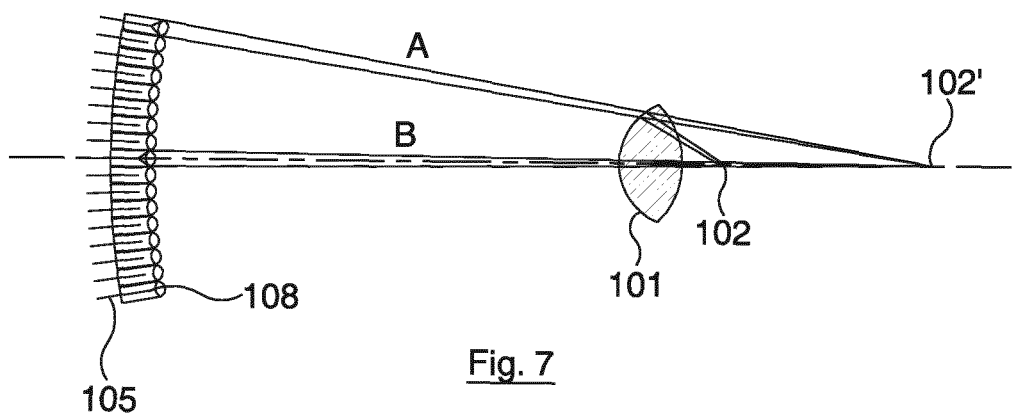
FIG. 7 schematically depicts a radiation source according to another embodiment of the present invention.

FIG. 7 shows a further embodiment of the invention in which rather than arranging the lasers 105 in an array such that the laser outputs are arranged parallel to the optical axis, in the embodiment of FIG. 7 the lasers 105 are arranged directed towards a location 102' on the optical axis. Location 102' may be the desired location but more preferably the output beams of the lasers 105 are focused on the desired location 102 behind final focusing lens 101. Final focusing lens 101 increases beam convergence and compresses the beam waist. By adjusting the power distribution within the set of lasers 105 it is possible to achieve a heat load onto the lens 101 that does not cause an expansion of the lens 101 sufficient to affect the focal length. For example, lasers 105 furthest from the optical axis may carry more power in order to level the temperature field within the lens 101. Each laser 105 may be provided with a collimator 108.

Figure 8A:
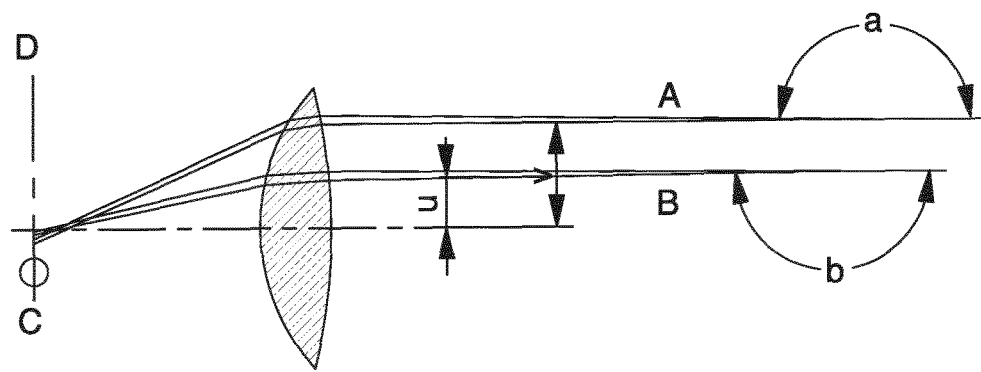
FIGS. 8(a) and 8(b) schematically depict a radiation source according to another embodiment of the present invention.
Figure 8B:
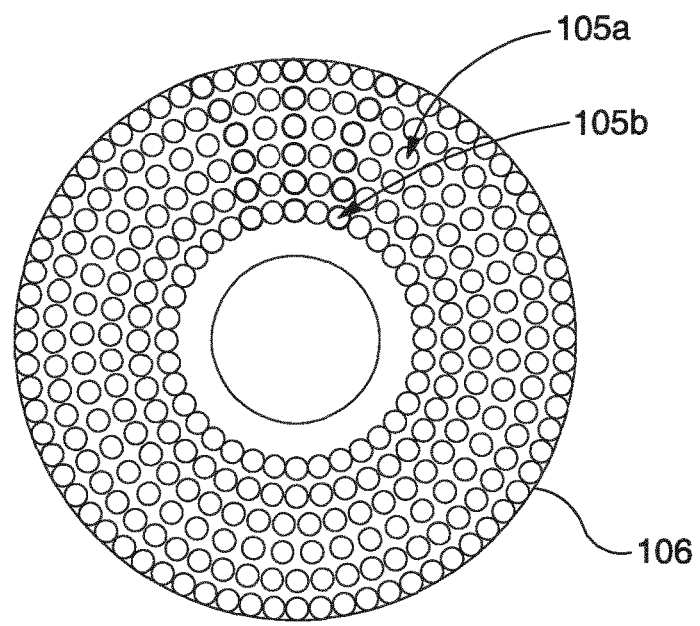

In an LPP source the target fuel droplet may be subject to two separate laser pulses. The first pulse is a pre-pulse that conditions the fuel droplet into an optimum condition (e.g., a pancake shape) for the subsequent main laser pulse to create an EUV generating plasma. Since the target fuel droplets are moving and the pre-pulse is applied before the main pulse the fiber lasers providing the pre-pulse should be focused at a different location from the fiber lasers providing the main pulse. FIGS. 8(*a*) and (*b*) illustrate an embodiment of the invention showing how this may be achieved. FIG. 8(*a*) illustrates how lasers from two groups may be used respectively for providing the pre-pulse and the main pulse. In FIG. 8(*a*) A indicates a beam of radiation from a fiber laser in the first group that has a divergence a and is provided a distance v from the optical axis, while B indicates a beam of radiation from a fiber laser in the second group that has a divergence b and is a distance u from the optical axis. As can be seen from FIG. 8(*a*) a fiber from the first group with a convergence/divergence a will be focused at a different location on a line D-C (which represents the trajectory of the fuel droplets) from a fiber laser from the second group, which is designed to provide the main pulse and the radiation from which has a convergence b and which may be parallel to the optical axis. FIG. 8(*b*) shows a frontal view of the mounting 106 carrying an annular array of lasers 105. The lasers 105 are divided into two groups: a first group of fiber lasers 105*a* that generate diverging beams and are used for target shaping, while a second group of fiber lasers 105*b* generate parallel beams and are used to provide the main laser pulse. The pre-pulse lasers 105*a* may provide shorter pulses than the main pulse lasers 105*b*. A suitable fiber laser for the pre-pulse lasers 105*a* may have a pulse duration of <70 ps, laser flash energy <1 mJ (typically 0.1 mJ) and a repetition frequency of greater than 100 kHz. This has the advantage that each individual pre-pulse may have an energy that is less than a conventional pre-pulse and thus the pressure on the target is less and resulting fragments are larger. The pre-pulse lasers 105*a* may be run in a burst mode to provide N (e.g., 2 to 10) pulses per shaping event from N individual fibers in order to follow the droplet mass center. In this way a resulting mist of droplets has a more limited size distribution and thus reduced risk of target burn-off. Since the pre-pulse is applied to a target fuel droplet before it reaches the point at which the plasma is created the lasers 105*a* are focused to a different spot from the lasers 105*b*. The wavelengths of the two types of lasers may differ so that the resultant combined beam has a waist provided at a different location for the pre-pulse than for the main pulse owing to differences in refraction in the final lens.

An advantage of embodiments of the present invention is that it enables scaling up of the total laser power. This can be achieved either by firing all lasers simultaneously, or by dividing the lasers into groups that fire alternately. In the latter case the groups should be preferably symmetrical in order to ensure good illumination uniformity.

If all the lasers feature slightly different wavelengths (which can be arranged) then there is no interference between beams and the resulting beam waist is simply the sum of individual overlapping beam waists. If the lasers do have the same wavelength and phase (which is possible if a seeding laser is used and the optical path of each fiber is controlled for example by section heating) the resulting beam waist is subject to interference.

Figure 9:
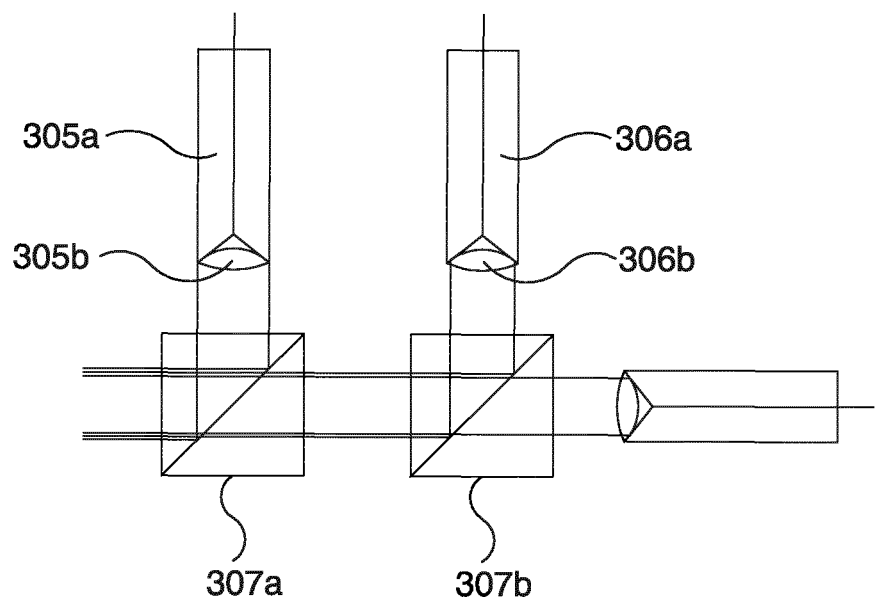
FIG. 9 schematically depicts a radiation source according to another embodiment of the present invention.

FIG. 9 shows another method for forming a laser beam from multiple lasers. The wavelengths of mid-IR fiber lasers can be easily adjusted for example by selecting the composition of the fiber. Multiple beams with different wavelengths can thus be merged using dichroic mirrors. Referring to FIG. 9 there are shown two fiber lasers 305a,306a and two associated dichroic mirrors 307a,307b. To account for possible chromaticity of the final lens (not shown in FIG. 9) each laser 305a,306a may be provided with a compensating lens 305b,306b mounted at the output of each individual laser.

It will also be understood that the above geometries may be combined. For example, laser beams generated by multiple fiber lasers may be combined using dichroic mirrors to form single enlarged beams that may then be provided as inputs to the optics of the embodiments of FIGS. 3 to 8.

Embodiments of the present invention provide a number of significant advantages. For example compared with a single $CO_2$ laser for a given power (e.g., 100 kW) embodiments of the invention provide a source that is less expensive, smaller and lighter. Embodiments of the invention enable direct power scalability where the output power is proportional to the number of fiber lasers used.

Embodiments of the invention provide high stability with pulses of even power and illumination uniformity. At the same time embodiments of the invention provide for the possibility of providing fine control and adjustment of the power between pulses if that is desired. For example, the power can be controlled by selecting the number of fiber lasers that are used in a given burst. By controlling the number of individual lasers that are used in a burst and the power of each individual laser it may also be possible to control the beam waist and in particular to provide non-classical beam waists for example for longer target plasma containment and postponed burn-off. Further control may be provided by applying phase control to each fiber laser by heating a section of the laser or by subjecting the laser to a mechanical stress.

The power of each individual fiber laser is moderate (around 100 W) thus minimizing cooling and maintenance requirements. The moderate power of each fiber laser means that there is virtually no degradation of the optics and no heat induced aberrations. Furthermore the distributed nature of the laser source allows for control of the heat load in the optical system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LEDs, solar cells, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

When describing the lithographic apparatus, the term "lens," where the context allow, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. In particular, the subject-matter according to the following clauses are considered to be within the scope of this disclosure.

i. A lithographic apparatus including a radiation source comprising an array of individual lasers and a beam compression system, wherein said lasers are configured to be focused at a common focal point to which in use a fuel target may be supplied.

ii. Apparatus according to clause i wherein said lasers are fiber lasers.

iii. Apparatus according to clause i or ii wherein said radiation source includes an optical axis and wherein said plurality of individual lasers are arranged such that they emit radiation that is parallel to said optical axis.

iv. Apparatus according to clause iii wherein said lasers are arranged symmetrically about said optical axis.

v. Apparatus according to any one of clauses i to iv wherein an optical system collects radiation from said array of individual lasers and focuses said radiation at said common focal point.

vi. Apparatus according to clause v wherein said optical system is a telescopic optical system.

vii. Apparatus according to clause vi wherein said optical system includes a first mirror for collecting radiation emitted by said plurality of individual lasers, a second mirror that receives radiation from said first mirror and which directs said radiation to a final focusing lens.

viii. Apparatus according to clause vii wherein an orifice is provided between said first and second mirrors.

ix. Apparatus according to any one of clauses vii or viii wherein said first mirror is formed with an opening located on the optical axis.

x. Apparatus according to clause ix wherein said apparatus further comprises a fuel delivery system for delivering fuel targets for ignition at said common focal point, and a collector for collecting radiation generated by ignition of said fuel targets, wherein said collector is provided between said common focal point and said first mirror.

xi. Apparatus according to clause x wherein said collector has an opening and wherein said fuel delivery system extends through the opening in said first mirror and the opening in said collector.

xii. Apparatus according to clause xi wherein said opening is provided on the optical axis xiii. Apparatus according to clause x wherein said collector has an opening located on the optical axis and wherein a gas flow guide extends through the opening in said first mirror and the opening in said collector for delivering a gas to the surface of said collector.

xiv. Apparatus according to clause i or ii wherein said array of individual lasers are arranged about an optical axis such that radiation emitted by said lasers is directed towards said optical axis.

xv. Apparatus according to clause xiv wherein said beam compression system comprises a final focusing lens provided for focusing said radiation on said common focal point.

xvi. Apparatus according to any preceding clause wherein radiation emitted by a plurality of individual lasers is combined into a single radiation beam by a plurality of dichroic mirrors.

xvii. Apparatus according to any preceding clause wherein said individual lasers are mounted on a mounting plate.

xviii. Apparatus according to any preceding clause wherein each individual laser is provided with a collimator.

xix. Apparatus according to any preceding clause wherein said array of individual lasers are arranged into more than one group whereby each said group may be individually controlled.

xx. Apparatus according to clause xix wherein the lasers in one said group may be fired at a different time from the lasers in another said group.

xxi. Apparatus according to clause xix or xx wherein radiation from the lasers in one group may be focused at a different location from the lasers in another group.

xxii. Apparatus according to clause xix wherein individual lasers or groups of lasers may be fired in sequence to shape a power pulse as a function of time.

xxiii. Apparatus according to clause xix wherein a selected group or groups of lasers may be configured to provide a pre-pulse.

xxiv. Apparatus according to clause xxiii wherein group or groups of lasers providing the pre-pulse is focused at a different location from the remaining lasers.

xxv. Apparatus according to clause xxiii or xxiv wherein the group or groups of lasers providing the pre-pulse are operated at a different wavelength from the remaining lasers.

xxvi. Apparatus according to any preceding clause wherein said individual lasers emit radiation at a wavelength of from 1 to 5 μm.

xxvii. Apparatus according to any preceding clause wherein each said individual laser emits at a power of greater than 1 W.

xxviii. Apparatus according to any preceding clause wherein at least some of said fiber lasers may be provided with phase control by heating a section of said fiber lasers or by subjecting said fiber lasers to mechanical stress.

xxix. Apparatus according to any preceding clause wherein each said fiber laser is provided with a collimator.

xxx. Apparatus according to clause xxix wherein said collimator is located at an end of a respective fiber laser and each said collimator and each said fiber laser end is immersed in a liquid.

xxxi. Apparatus according to any preceding clauses wherein said individual lasers may be controlled to provide a controlled heat load in an optical system.

xxxii. A method of generating radiation for use in a lithographic apparatus comprising, supplying a fuel target to an ignition location, and igniting said fuel targets with laser radiation to generate a plasma, wherein said laser radiation is emitted from an array of individual lasers configured to be focused at a common focal point by a beam compression system.

xxxiii. A method according to clause xxxii wherein said lasers are fiber lasers.

xxxiv. A method according to clause xxxii or xxxiii wherein said radiation source includes an optical axis and wherein said plurality of individual lasers are arranged such that they emit radiation that is parallel to said optical axis.

xxxv. A method according to clause xxxiv comprising providing said fiber lasers symmetrically about said optical axis.

xxxvi. A method according to any preceding clause comprising providing an optical system configured to collect radiation from said plurality of individual lasers and to focus said radiation at said common focal point.

xxxvii. A method according to clause xxxvi wherein said optical system is a telescopic optical system.

xxxviii. A method according to clause xxxvii wherein said optical system includes a first mirror for collecting radiation emitted by said plurality of individual lasers, a second mirror that receives radiation from said first mirror and which directs said radiation to a final focusing lens.

xxxix. A method according to clause xxxviii comprising providing between said first and second mirrors a blocking element adapted to block back-scattered radiation.

xl. A method according to clause xxxviii or xxxix comprising forming said first mirror with an opening located on the optical axis.

xli. A method according to clause xl further comprising delivering fuel targets for ignition at said common focal point, and collecting by means of a collector radiation generated by ignition of said fuel targets.

xlii. A method according to clause xli wherein said method comprises extending a fuel delivery system through an opening in said first mirror and an opening in said collector.

xliii. A method according to clause xlii comprising providing said openings on the optical axis.

xliv. A method according to clause xli wherein said method comprises delivering a gas to the surface of said collector through a gas flow guide extending through an opening in said first mirror and an opening in said collector.

xlv. A method according to clause xxxii comprising arranging said plurality of individual lasers about an optical axis such that radiation emitted by said lasers is directed towards said optical axis.

xlvi. A method according to clause xlv comprising focusing said radiation on said common focal point by means of a final focus lens.

xlvii. A method according to clause xxxii wherein said method comprises using a plurality of dichroic mirrors to combine radiation emitted by a plurality of individual lasers into a single radiation beam.

xlviii. A method according to any one of clauses xxxii to xlvii comprising mounting said individual lasers on a mounting plate.

xlix. A method according to any one of clauses xxxii to xlviii wherein the output of each individual laser is collimated.

l. A method according to any preceding clause comprising, arranging said array of individual lasers into more than one group whereby each said group may be individually controlled.

li. A method according to clause l wherein the lasers in one said group may be fired at a different time from the lasers in another said group.

lii. A method according to clause l or li wherein radiation from the lasers in one group may be focused at a different location from the lasers in another group.

liii. A method according to clause l wherein individual lasers or groups of lasers may be fired in sequence to shape a power pulse as a function of time.

liv. A method according to clause l wherein a selected group or groups of lasers may be configured to provide a pre-pulse.

lv. A method according to clause liv wherein group or groups of lasers providing the pre-pulse is focused at a different location from the remaining lasers.

lvi. A method according to clause lvi or lv wherein the group or groups of lasers providing the pre-pulse are operated at a different wavelength from the remaining lasers.

lvii. A method according to any one of clauses xxxii to lvi wherein said individual lasers emit radiation at a wavelength of from 1 to 5 µm.

lviii. A method according to any one of clauses xxxii to lvii wherein each said individual laser emits radiation at a power of greater than 1 W.

lix. A method according to any one of clauses xxxii to lviii wherein at least some of said fiber lasers may be provided with phase control by heating a section of said fiber lasers or by subjecting said fiber lasers to mechanical stress.

lx. A method according to any one of clauses xxxii to lix wherein each said fiber laser is provided with a collimator.

lxi. A method according to clause lx comprising locating said collimator at an end of a respective fiber laser and immersing each said collimator and each said fiber laser end in a liquid.

lxii. A method according to any one of clauses xxxii to lxi further comprising controlling said individual lasers to provide a controlled heat load in an optical system.

lxiii. A lithographic apparatus comprising: a radiation source comprising an array of individual lasers and a beam compression system, wherein said lasers are configured to be focused at a common focal point at which a fuel target is supplied.

lxiv. The apparatus of clause lxiii, wherein said lasers are fiber lasers.

lxv. The apparatus of clause lxiii, wherein said radiation source includes an optical axis, and wherein said plurality of individual lasers are arranged such that they emit radiation that is parallel to said optical axis.

lxvi. The apparatus of clause lxv, wherein said lasers are arranged symmetrically about said optical axis.

lxvii. The apparatus of clause lxiii, wherein an optical system collects radiation from said array of individual lasers and focuses said radiation at said common focal point.

lxviii. The apparatus of clause lxvii, wherein said optical system is a telescopic optical system.

lxix. The apparatus of clause lxviii, wherein said optical system includes a first mirror for collecting radiation emitted by said plurality of individual lasers, a second mirror that receives radiation from said first mirror and which directs said radiation to a final focusing lens.

lxx. The apparatus of clause lxix, wherein an orifice is provided between said first and second mirrors.

lxxi. The apparatus of clause lxx, wherein said first mirror is formed with an opening located on the optical axis.

lxxii. The apparatus of clause lxxi, wherein said apparatus further comprises a fuel delivery system for delivering fuel targets for ignition at said common focal point, and a collector for collecting radiation generated by ignition of said fuel targets, wherein said collector is provided between said common focal point and said first mirror.

lxxiii. The apparatus of clause lxxii, wherein said collector has an opening and wherein said fuel delivery system extends through the opening in said first mirror and the opening in said collector.

lxxiv. The apparatus of clause lxxiii, wherein said opening is provided on the optical axis.

lxxv. The apparatus of clause lxxii, wherein said collector has an opening located on the optical axis and wherein a gas flow guide extends through the opening in said first mirror and the opening in said collector for delivering a gas to the surface of said collector.

lxxvi. The apparatus of clause lxiii, wherein said array of individual lasers are arranged about an optical axis such that radiation emitted by said lasers is directed towards said optical axis.

lxxvii. The apparatus of clause lxxvi, wherein said beam compression system comprises a final focusing lens provided for focusing said radiation on said common focal point.

lxxviii. The apparatus of clause lxiii, wherein radiation emitted by a plurality of individual lasers is combined into a single radiation beam by a plurality of dichroic mirrors.

lxxix. The apparatus of clause lxiii, wherein said individual lasers are mounted on a mounting plate.

lxxx. The apparatus of clause lxiii, wherein each individual laser is provided with a collimator.

lxxxi. The apparatus of clause lxiii, wherein said array of individual lasers are arranged into more than one group whereby each said group may be individually controlled.

lxxxii. The apparatus of clause lxxxi, wherein the lasers in one said group may be fired at a different time from the lasers in another said group.

lxxxiii. The apparatus of clause lxxxii, wherein radiation from the lasers in one group may be focused at a different location from the lasers in another group.

lxxxiv. The apparatus of clause lxxxi, wherein individual lasers or groups of lasers may be fired in sequence to shape a power pulse as a function of time.

lxxxv. The apparatus of clause lxxxi, wherein a selected group or groups of lasers may be configured to provide a pre-pulse.

lxxxvi. The apparatus of clause lxxxv, wherein group or groups of lasers providing the pre-pulse is focused at a different location from the remaining lasers.

lxxxvii. The apparatus of clause lxxxvi, wherein the group or groups of lasers providing the pre-pulse are operated at a different wavelength from the remaining lasers.

lxxxviii. The apparatus of clause lxiii, wherein said individual lasers emit radiation at a wavelength of from 1 to 5 µm.

lxxxix. The apparatus of clause lxiii, wherein each said individual laser emits at a power of greater than 1 W.

xc. The apparatus of clause lxiii, wherein at least some of said fiber lasers may be provided with phase control by heating a section of said fiber lasers or by subjecting said fiber lasers to mechanical stress.

xci. The apparatus of clause lxiii, wherein each said fiber laser is provided with a collimator.

xcii. The apparatus of clause xci, wherein said collimator is located at an end of a respective fiber laser and each said collimator and each said fiber laser end is immersed in a liquid.

xciii. The apparatus of clause lxiii, wherein said individual lasers may be controlled to provide a controlled heat load in an optical system.

xciv. A method of generating radiation for use in a lithographic apparatus, the method comprising:
supplying a fuel target to an ignition location; and
igniting said fuel targets with laser radiation to generate a plasma,
wherein said laser radiation is emitted from an array of individual lasers configured to be focused at a common focal point by a beam compression system.

xcv. The method of clause xciv wherein said lasers are fiber lasers.

xcvi. The method of clause xciv, wherein said radiation source includes an optical axis and wherein said plurality of individual lasers are arranged such that they emit radiation that is parallel to said optical axis.

xcvii. The method of clause xcvi, further comprising providing said fiber lasers symmetrically about said optical axis.

xcviii. The method of clause xciv, further comprising providing an optical system configured to collect radiation from said plurality of individual lasers and to focus said radiation at said common focal point.

xcix. The method of clause xcviii, wherein said optical system is a telescopic optical system.

c. The method of clause xcix, wherein said optical system includes a first mirror for collecting radiation emitted by said plurality of individual lasers, a second mirror that receives radiation from said first mirror and which directs said radiation to a final focusing lens.

ci. The method of clause c, further comprising providing between said first and second mirrors a blocking element adapted to block back-scattered radiation.

cii. The method of clause c, further comprising forming said first mirror with an opening located on the optical axis.

ciii. The method of clause cii. further comprising delivering fuel targets for ignition at said common focal point, and collecting by a collector radiation generated by ignition of said fuel targets.

civ. The method of clause ciii, further comprising extending a fuel delivery system through an opening in said first mirror and an opening in said collector.

cv. The method of clause civ, further comprising providing said openings on the optical axis.

cvi. The method of clause ciii, further comprising delivering a gas to the surface of said collector through a gas flow guide extending through an opening in said first mirror and an opening in said collector.

cvii. The method of clause xciv, further comprising arranging said plurality of individual lasers about an optical axis such that radiation emitted by said lasers is directed towards said optical axis.

cviii. The method of clause cvii, further comprising focusing said radiation on said common focal point by means of a final focus lens.

cix. The method of clause xciv, further comprising using a plurality of dichroic mirrors to combine radiation emitted by a plurality of individual lasers into a single radiation beam.

cx. The method of clause xciv, further comprising mounting said individual lasers on a mounting plate.

cxi. The method of clause xciv, wherein the output of each individual laser is collimated.

cxii. The method of clause xciv, further comprising arranging said array of individual lasers into more than one group whereby each said group may be individually controlled.

cxiii. The method of clause cxii, wherein the lasers in one said group may be fired at a different time from the lasers in another said group.

cxiv. The method of clause cxiii, wherein radiation from the lasers in one group may be focused at a different location from the lasers in another group.

cxv. The method of clause cxii, wherein individual lasers or groups of lasers may be fired in sequence to shape a power pulse as a function of time.

cxvi. The method of clause cxii, wherein a selected group or groups of lasers may be configured to provide a pre-pulse.

cxvii. The method of clause cxvi, wherein group or groups of lasers providing the pre-pulse is focused at a different location from the remaining lasers.

cxviii. The method of clause cxvii, wherein the group or groups of lasers providing the pre-pulse are operated at a different wavelength from the remaining lasers.

cxix. The method of clause xciv, wherein said individual lasers emit radiation at a wavelength of from 1 to 5 µm.

cxx. The method of clause xciv, wherein each said individual laser emits radiation at a power of greater than 1 W.

cxxi. The method of clause xciv, wherein at least some of said fiber lasers may be provided with phase control by heating a section of said fiber lasers or by subjecting said fiber lasers to mechanical stress.

cxxii. The method of clause xciv, wherein each said fiber laser is provided with a collimator.

cxxiii. The method of clause cxxii, further comprising locating said collimator at an end of a respective fiber laser and immersing each said collimator and each said fiber laser end in a liquid.

cxxiv. The method of clause xciv, further comprising controlling said individual lasers to provide a controlled heat load in an optical system.

Furthermore, it will be apparent to one skilled in the art that modifications may be made to the invention as described without departing from the scope of the claims that follow.

The invention claimed is:

1. A radiation source configured for use with a lithographic apparatus, the radiation source comprising:
an array of individual lasers; and
a beam compression system configured to focus radiation beams emitted at a same time from at least two lasers of the array of individual lasers at a common focal point of the at least two lasers, wherein the radiation beams together interact with one fuel target to one of condition the fuel target or create a plasma from a conditioned fuel target.

2. The radiation source of claim 1, further comprising an optical system configured to collect the radiation beams from the at least two lasers of the array of individual lasers and focus the radiation beams at the common focal point.

3. The radiation source of claim 2, wherein the optical system is a telescopic optical system and wherein the optical system includes a first mirror for collecting the radiation beams emitted by the at least two lasers of the plurality of individual lasers, a second mirror that receives radiation from the first mirror and which directs the radiation to a final focusing lens.

4. The radiation source of claim 3, wherein the first mirror is formed with an opening located on an optical axis.

5. The radiation source of claim 4, further comprising:
a fuel delivery system for delivering fuel targets for ignition at the common focal point; and
a collector for collecting radiation generated by ignition of the fuel targets, wherein the collector is provided between the common focal point and the first mirror.

6. The radiation source of claim 5, wherein the collector has an opening and the fuel delivery system extends through the opening in the first mirror and the opening in the collector.

7. The radiation source of claim 5, wherein the collector has an opening located on the optical axis and wherein a gas flow guide extends through the opening in the first mirror and the opening in the collector for delivering a gas to a surface of the collector.

8. The radiation source of claim 1, wherein the array of individual lasers is arranged into a first group of lasers and a second group of lasers, wherein the first group and the second group are individually controlled.

9. The radiation source of claim 8, wherein the first group of lasers is fired at a different time than the second group of lasers.

10. The radiation source of claim 8, wherein radiation from the first group of lasers is focused at a different location than radiation from the second group of lasers.

11. The radiation source of claim 8, wherein the first and second groups of lasers are fired in sequence to shape a power pulse as a function of time.

12. The radiation source of claim 8, wherein the first group of lasers is configured to provide a pre-pulse.

13. The radiation source of claim 12, wherein the first group of lasers providing the pre-pulse is focused at a different location than the second group of lasers.

14. The radiation source of claim 12, wherein the first group of lasers providing the pre-pulse is operated at a different wavelength from the second group of lasers.

15. The radiation source of claim 12, wherein the second group of lasers is configured to provide a main pulse.

16. A method of generating radiation for use in a lithographic apparatus comprising:
supplying a fuel target to an ignition location; and
igniting the fuel target with laser radiation to one of condition the fuel target or create a plasma from a conditioned fuel target, wherein at least two lasers of an array of individual lasers are configured to emit radiation beams at a same time and the emitted radiation beams are focused at a common focal point of the at least two lasers by a beam compression system to generate the laser radiation.

17. The method of claim 16, wherein the array of individual lasers is arranged into a first group of lasers and a second group of lasers, and the method further comprises individually controlling the first group and the second group.

18. The method of claim 17, further comprising:
firing the first group of lasers at a different time than the second group of lasers.

19. The method of claim 17, further comprising:
focusing radiation from the first group of lasers at a different location than radiation from the second group of lasers.

20. The method of claim 17, further comprising:
firing the first and second groups of lasers in sequence to shape a power pulse as a function of time.

21. The method of claim 17, wherein the first group of lasers is fired to provide a pre-pulse.

22. The method of claim 21, wherein the second group of lasers is configured to provide a main pulse.

23. A radiation source configured for use with a lithographic apparatus, the radiation source comprising:
a pre-pulse laser comprising a first array of individual lasers;
a main pulse laser comprising a second array of individual lasers; and
a beam compression system configured to:
focus radiation beams emitted at a same time from at least two lasers of the first array of individual lasers at a first common focal point of the at least two lasers of the first array of individual lasers, and
focus radiation beams emitted at a same time from at least two lasers of the second array of individual lasers at a second common focal point of the at least two lasers of the second array of individual laser,
wherein the radiation beams from the at least two lasers of the first array of individual lasers are emitted at a different time than the radiation beams from the at least two lasers of the second array of individual lasers.

* * * * *